(12) United States Patent
Baselmans et al.

(10) Patent No.: US 6,650,399 B2
(45) Date of Patent: Nov. 18, 2003

(54) LITHOGRAPHIC PROJECTION APPARATUS, A GRATING MODULE, A SENSOR MODULE, A METHOD OF MEASURING WAVE FRONT ABERRATIONS

(75) Inventors: Johannes Jacobus Matheus Baselmans, Oirschot (NL); Marco Hugo Petrus Moers, Eindhoven (NL); Hans Van Der Laan, Veldhoven (NL); Robert Wilhelm Willekers, Oirschot (NL); Wilhelmus Petrus De Boeij, Veldhoven (NL); Marcus Adrianus Van De Kerkhof, Helmond (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 10/073,119

(22) Filed: Feb. 12, 2002

(65) Prior Publication Data

US 2002/0145717 A1 Oct. 10, 2002

(30) Foreign Application Priority Data

Feb. 13, 2001 (EP) ............................................ 01301283

(51) Int. Cl.$^7$ .......................... G03B 27/42; G03B 27/52
(52) U.S. Cl. ......................................... 355/55; 355/53
(58) Field of Search .............................. 355/52, 53, 55, 355/67–71; 356/359, 520–521, 399–401

(56) References Cited

U.S. PATENT DOCUMENTS

| | | | | |
|---|---|---|---|---|
| 5,760,879 | A | * 6/1998 | Shinonaga et al. | 355/55 |
| 5,898,501 | A | * 4/1999 | Suzuki et al. | 356/359 |
| 6,100,978 | A | 8/2000 | Naulleau et al. | 356/354 |
| 6,118,535 | A | 9/2000 | Goldberg et al. | 356/354 |
| 6,233,056 | B1 | * 5/2001 | Naulleau et al. | 356/520 |
| 6,456,382 | B2 | * 9/2002 | Ichihara et al. | 356/513 |

OTHER PUBLICATIONS

Goldberg et al., "High–accuracy interferometry of extreme ultraviolet lithographic optical systems," *J. Vac. Sci. Technol. B* 16(6):3435–3439 (1998).
Braat et al., "Improved Ronchi test with extended source," *J. Opt. Soc. Am. A* 16(1):131–140 (1999).
Venkataraman, et al., "Aberrations of steppers using Phase Shifting Point Diffraction Interferometry," In *Optical Microlithography XIII*, Christopher J. Progler, Ed., Proceedings of SPIE 4000:1245–1249 (2000).
A copy of the European Search Report dated Aug. 24, 2001 issued in the corresponding European application No. EP 01 30 1283.

* cited by examiner

Primary Examiner—Henry Hung Nguyen
(74) Attorney, Agent, or Firm—Pillsbury Winthrop LLP

(57) ABSTRACT

A lithographic projection apparatus including an illumination system; a support structure for holding a mask; a substrate table for holding a substrate; a projection system for projecting a pattern onto a target portion of the substrate; and an interferometric measurement system for measuring wave front aberrations of the projection system, characterized in that the interferometric measurement system including: a grating, featuring a grating pattern in a grating plane, said grating being movable into and out of the projection beam, such that the grating plane is substantially coincident with said object plane; a pinhole, featuring a pinhole pattern in a pinhole plane and arranged in a pinhole plate, said pinhole being movable into and out of the projection beam, such that the pinhole plane is substantially coincident with a plane downstream of the projection system and optically conjugate to said object plane, and a detector with a detector surface substantially coincident with a detection plane, said detection plane located downstream of the pinhole at a location where a spatial distribution of the electric field amplitude of the projection beam is substantially a Fourier transformation of a spatial distribution of the electric field amplitude of the projection beam in the pinhole plane.

15 Claims, 7 Drawing Sheets

LITHOGRAPHIC PROJECTION APPARATUS, A GRATING MODULE, A SENSOR MODULE, A METHOD OF MEASURING WAVE FRONT ABERRATIONS

BACKGROUND OF THE INVENTION

This application claims priority from EP01301283.6 filed Feb. 13, 2001, herein incorporated by reference.

1. Field of the Invention

The present invention relates generally to lithographic projection apparatus and more particularly to lithographic projection apparatus including an interferometric measurement system.

2. Background of the Related Art

A typical lithographic projection apparatus includes:

- a radiation system for providing a projection beam of radiation;
- a support structure for supporting patterning structure, the patterning structure serving to pattern the projection beam, according to a desired pattern, in an object plane traversed by the projection beam;
- a substrate table for holding a substrate;
- a projection system downstream of said object plane, for projecting the patterned beam onto a target portion of the substrate;
- an interferometric measurement system for measuring wave front aberrations of the projection system.

The term "patterning structure" as here employed should be broadly interpreted as referring to structure that can be used to endow an incoming radiation beam with a patterned cross-section in an object plane traversed by the projection beam, corresponding to a pattern that is to be created in a target portion of the substrate. Said target portion is, through the projection system, optically conjugate to the object plane. The projection system has a magnification factor M (generally <1) in relation to said object plane. The term "light valve" can also be used in this context. Generally, the said pattern will correspond to a particular functional layer in a device being created in the target portion, such as an integrated circuit or other device (see below). Examples of such patterning structure include:

- A mask. The concept of a mask is well known in lithography, and it includes mask types such as binary, alternating phase-shift, and attenuated phase-shift, as well as various hybrid mask types. Placement of such a mask in the radiation beam causes selective transmission (in the case of a transmissive mask) or reflection (in the case of a reflective mask) of the radiation impinging on the mask, according to the pattern on the mask. In the case of a mask, the support structure will generally be a mask table, which ensures that the mask can be held at a desired position in the incoming radiation beam, and that it can be moved relative to the beam if so desired.
- A programmable mirror array. One example of such a device is a matrix-addressable surface having a viscoelastic control layer and a reflective surface. The basic principle behind such an apparatus is that (for example) addressed areas of the reflective surface reflect incident light as diffracted light, whereas unaddressed areas reflect incident light as undiffracted light. Using an appropriate filter, the said undiffracted light can be filtered out of the reflected beam, leaving only the diffracted light behind; in this manner, the beam becomes patterned according to the addressing pattern of the matrix-adressable surface. An alternative embodiment of a programmable mirror array employs a matrix arrangement of tiny mirrors, each of which can be individually tilted about an axis by applying a suitable localized electric field, or by employing piezoelectric actuation means. Once again, the mirrors are matrix-addressable, such that addressed mirrors will reflect an incoming radiation beam in a different direction to unaddressed mirrors; in this manner, the reflected beam is patterned according to the addressing pattern of the matrix-adressable mirrors. The required matrix addressing can be performed using suitable electronic means. In both of the situations described hereabove, the patterning structure can comprise one or more programmable mirror arrays. More information on mirror arrays as here referred to can be gleaned, for example, from U.S. Pat. No. 5,296,891 and U.S. Pat. No. 5,523,193, and PCT patent applications WO 98/38597 and WO 98/33096, which are incorporated herein by reference. In the case of a programmable mirror array, the said support structure may be embodied as a frame or table, for example, which may be fixed or movable as required.
- A programmable LCD array. An example of such a construction is given in U.S. Pat. No. 5,229,872, which is incorporated herein by reference. As above, the support structure in this case may be embodied as a frame or table, for example, which may be fixed or movable as required.

For purposes of simplicity, the rest of this text may, at certain locations, specifically direct itself to examples involving a mask and mask table; however, the general principles discussed in such instances should be seen in the broader context of the patterning structure as hereabove set forth.

Lithographic projection apparatus can be used, for example, in the manufacture of integrated circuits (ICs). In such a case, the patterning structure may generate a circuit pattern corresponding to an individual layer of the IC, and this pattern can be imaged onto a target portion (e.g. comprising one or more dies) on a substrate (silicon wafer) that has been coated with a layer of radiation-sensitive material (resist). In general, a single wafer will contain a whole network of adjacent target portions that are successively irradiated via the projection system, one at a time. In current apparatus, employing patterning by a mask on a mask table, a distinction can be made between two different types of machine. In one type of lithographic projection apparatus, each target portion is irradiated by exposing the entire mask pattern onto the target portion at once; such an apparatus is commonly referred to as a wafer stepper. In an alternative apparatus—commonly referred to as a step-and-scan apparatus—each target portion is irradiated by progressively scanning the mask pattern under the projection beam in a given reference direction (the "scanning" direction) while synchronously scanning the substrate table parallel or anti-parallel to this direction; since, in general, the projection system will have a magnification factor M (with M <1) the speed V at which the substrate table is scanned will be a factor M times that at which the mask table is scanned. More information with regard to lithographic devices as here described can be gleaned, for example, from U.S. Pat. No. 6,046,792, incorporated herein by reference.

In a manufacturing process using a lithographic projection apparatus, a pattern (e.g. in a mask) is imaged onto a substrate that is at least partially covered by a layer of radiation-sensitive material (resist). Prior to this imaging step, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g. an IC. Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4, incorporated herein by reference.

For the sake of simplicity, the projection system may hereinafter be referred to as the "lens"; however, this term should be broadly interpreted as encompassing various types of projection system, including refractive optics, reflective optics, and catadioptric systems, for example. The radiation system may also include components operating according to any of these design types for directing, shaping or controlling the projection beam of radiation, and such components may also be referred to below, collectively or singularly, as a "lens". The position of a second element traversed by the projection beam relative to a first element traversed by the projection beam will for simplicity hereinafter be referred to as "downstream" of or "upstream" of said first element. In this context, the expression "downstream" indicates that a displacement from the first element to the second element is a displacement along the direction of propagation of the projection beam; similarly, "upstream" indicates that a displacement from the first element to the second element is a displacement opposite to the direction of propagation of the projection beam. Further, the lithographic apparatus may be of a type having two or more substrate tables (and/or two or more mask tables). In such "multiple stage" devices the additional tables may be used in parallel, or preparatory steps may be carried out on one or more tables while one or more other tables are being used for exposures. Dual stage lithographic apparatus are described, for example, in U.S. Pat. No. 5,969,441 and WO 98/40791, incorporated herein by reference.

There is a desire to integrate an ever-increasing number of electronic components in an IC. To realize this it is necessary to decrease the size of the components and therefore to increase the resolution of the projection system, so that increasingly smaller details, or line widths, can be projected on a target portion of the substrate. For the projection system this means that the projection system and the lens elements used in the projection system must comply with very stringent quality requirements. Despite the great care taken during the manufacturing of lens elements and the projection system they both may still suffer from wave front aberrations, such as, for example, displacement, defocus, astigmatism, coma and spherical aberration across an image field projected with the projection system onto a target portion of the substrate. Said aberrations are important sources of variations of the imaged line widths occurring across the image field. It is important that the imaged line widths at different points within the image field are constant. If the line width variation is large, the substrate on which the image field is projected may be rejected during a quality inspection of the substrate. Using techniques such as phase-shifting masks, or off-axis illumination, the influence of wave front aberrations on the imaged line widths may further increase.

During manufacture of a lens element it is advantageous to measure the wave front aberrations of the lens element and to use the measured results to tune the aberrations in this element or even to reject this element if the quality is not sufficient. When lens elements are put together to form the projection system it may again be necessary to measure the wave front aberrations of the projection system. These measurements may be used to adjust the position of certain lens elements in the projection system in order to minimize wave front aberrations of the projection system.

After the projection system has been built into a lithographic projection apparatus, the wave front aberrations may be measured again. Moreover, since wave front aberrations are variable in time in a projection system, for instance, due to deterioration of the lens material or lens heating effects local heating of the lens material), it may be necessary to measure the aberrations at certain instants in time during operation of the apparatus and to adjust certain movable lens elements accordingly to minimize wave front aberrations. The short time scale, on which lens-heating effects may occur, may require measuring the wave front aberrations frequently.

The use of an interferometric measurement system for in-situ measurement of wave front aberrations of the projection system of a lithographic projection apparatus is described in P. Venkataraman, et al., "Aberrations of steppers using Phase Shifting Point Diffraction Interferometry", in *Optical Microlithography XIII*, J. Progler, Editor, Proceedings of SPIE Vol. 4000, 1245–1249 (2000). A Phase Shifting Point Diffraction Interferometry method and a corresponding system are disclosed in P. P. Naulleau et al., U.S. Pat. No. 6,100,978, issued Aug. 8, 2000, incorporated herein by reference. The Phase Shifting Point Diffraction Interferometry measurement method and corresponding measurement system will be referred to hereinafter as the PSPDI method and PSPDI system, respectively. The disclosed PSPDI systems feature the following elements, mentioned here in the order wherein these elements are traversed by the projection beam: a first pinhole in an object plane; a grating (with a one dimensional periodic structure of lines and spaces) between the object plane and the projection system, for generating by diffraction a test beam and a reference beam; the projection system, and a set of two pinholes comprising a window pinhole (traversed by the test beam) and a reference pinhole (traversed by the reference beam, and acting as a spatial filter for generating an unaberrated reference beam) in the plane that is optically conjugate to the object plane. The test beam and the reference beam generate an interference fringe pattern on a detector surface downstream of the set of two pinholes. This interference fringe pattern carries information on wave front aberrations. The grating, generally embodied as a grating pattern on a plane surface of a carrier substrate, acts as a beamsplitter; the grating shall be located downstream of said object plane such as to provide sufficient lateral separation of the areas traversed by the reference beam and the test beam in the plane that is optically conjugate to the object plane. Further, the grating is movable in a direction perpendicular to the direction of propagation of the projection beam such as to provide "phase shifting" (as explained below) of the interference fringe pattern with respect to a coordinate system associated with the detector surface, as needed for measuring aberrations.

Said phase shifting of the interference fringe pattern involves shifting the interference fringe pattern with respect to said coordinate system. For an explanation of "phase shifting" in relation to interferometry see, for example, D. Malacara, "Optical Shop Testing", John Wiley & Sons, Inc., New York, second edition. Movement of an optical element (such as, for example, a grating) to provide phase shifting will be referred to hereinafter as "phase stepping". A finite movement of an optical element (such as, for example, a grating) to provide a finite phase shift of said interference fringe pattern will be referred to hereinafter as a "phase step".

An embodiment of a PSPDI system in a lithographic projection apparatus comprises, besides the support structure for supporting patterning structure and the substrate table for holding a substrate, one or more dedicated, movable support structures for supporting the grating and/or for moving the grating into and out of the projection beam and/or for phase stepping the grating. Incorporation of these one or more dedicated support structures into the lithographic projection apparatus leads to added mechanical complexity and increased costs of manufacturing the lithographic projection apparatus. Further, as explained above, in a PSPDI system each individual beam (the test beam and the reference beam) impinging on the detector has traversed two pinholes, one pinhole upstream of the projection system, and one pinhole downstream of the projection system. This circumstance typical for a PSPDI system poses a limitation to the amount of radiation that may reach the detector, and hence, to the sensitivity of the measurement system.

SUMMARY OF THE INVENTION

One aspect of embodiments of the present invention provides a measurement system for measuring the wave front aberrations in a lithographic projection apparatus while alleviating the problem of incorporating one or more dedicated, movable support structures.

This and other aspects are achieved according to the invention in a lithographic projection apparatus as specified in the opening paragraph, characterized in that the interferometric measurement system comprises a grating, featuring a grating pattern in a grating plane, said grating being movable into and out of the projection beam, such that the grating plane is substantially coincident with said object plane;

a pinhole, featuring a pinhole pattern in a pinhole plane and arranged in a pinhole plate, said pinhole being movable into and out of the projection beam, such that the pinhole plane is substantially coincident with a plane downstream of the projection system and optically conjugate to said object plane, and a detector with a detector surface substantially coincident with a detection plane, said detection plane located downstream of the pinhole at a location where a spatial distribution of the electric field amplitude of the projection beam is substantially a Fourier Transformation of a spatial distribution of the electric field amplitude of the projection beam in the pinhole plane.

With the measurement system built into the lithographic projection apparatus it is possible to measure in situ the wave front aberration of the projection system. The term "grating pattern" in the context of the present invention should be interpreted throughout this text and in the claims to include any periodic structure. Also the term "pinhole pattern" in the context of the present invention should be interpreted throughout this text and in the claims to include one or more apertures of arbitrary shape such as, for example a circular shape, a slit shape, a rectangular shape, and a substantially square shape. Upon illumination of the grating, an intensity distribution featuring an interference fringe pattern of radiation representative of the wave front aberration of the projection system is obtained in said detection plane downstream of the pinhole. In the absence of any wave front aberration said interference fringe pattern is a substantially uniform intensity distribution. In the presence of wave front aberrations said intensity distribution will be non-uniform, and will generally comprise interference fringes. In the context of the present invention, the term "interference fringe pattern" besides referring to the common concept of interference fringes, should also be interpreted as referring to a substantially uniform intensity distribution, the latter intensity distribution being typical for the absence of aberrations. Some of the physical principles exploited in the present invention are discussed, for example, in J. Braat et al., "Improved Ronchi test with extended source", Journal of the Optical Society of America, Vol. 16, 131–139 (1999). Said detection plane may, for example, be located at a position downstream of the pinhole where the "Fraunhofer Diffraction" approximation is applicable to the calculation of the electric field amplitude of radiation emerging from the pinhole. At such a location a spatial distribution of the electric field amplitude of the projection beam is substantially a Fourier Transformation of a spatial distribution of the electric field amplitude of the projection beam in the pinhole plane.

Phase shifting of the interference fringe pattern with respect to a coordinate system associated with the detector surface, as needed for measuring aberrations, can be provided by phase stepping either the grating or the pinhole.

In case the patterning structure is a mask and the support structure is a mask table for holding the mask, the grating can be provided to a grating module that has the same outer extent as the mask, and the mask table can be used for holding the grating module. During measurement of the wave front aberrations the grating module may be held at a location where, during normal use of the projection apparatus, a mask is held. One advantage of this scenario is that there is no need to provide an additional support structure to hold the grating, and/or to move the grating in and out of the projection beam, and/or to phase step the grating. Another advantage is that, during projection, the mass of the grating is not added to the mass of the mask table, such that it is easier to accelerate and decelerate the mask table. As explained above, in a PSPDI system each individual beam (the test beam and/or the reference beam) impinging on the detector has traversed two pinholes, one pinhole upstream of the projection system, and one pinhole downstream of the projection system. These two pinholes are each embodied as a single pinhole aperture, and in contrast to the present invention do not feature a pinhole pattern that may comprise a plurality of apertures. This circumstance, typical for a PSPDI system, poses a limitation to the amount of radiation that may reach the detector. Another advantage of the present invention over the use of a PSPDI system is that said limitation can be relaxed by the use of pinhole patterns comprising a plurality of apertures, leading to improved sensitivity.

Instead of providing the grating to a grating module that has the same outer extent as the mask, one can, alternatively, provide the grating to the support structure at a location away from the location where the patterning structure is supported. Whenever it is necessary to measure the wave front aberrations of the projection system the grating can be easily moved into the projection beam to perform a wave front aberration measurement. After finishing the measurement the patterning structure is moved into the projection beam and the apparatus can continue projecting the patterned beam onto target portions of the substrate. This method of intermittently measuring wave front aberrations during operation of the lithographic projection apparatus is time saving, and enables, for example, a frequent measuring of wave front aberrations needed to compensate for short-time-scale lens-heating effects. In an alternative scenario, the patterning structure may also be used to pattern the projection beam with a grating pattern in its cross section. This is advantageous because no additional grating has to be provided to the apparatus.

The detector for detecting the radiation traversing the pinhole may, for example, be provided to the substrate table. Said pinhole plate may also, for example, be provided to the substrate table. One could also provide the pinhole plate and the detector to a sensor module which, during measurement of wave front aberrations, may be provided to the substrate table at a location where, during the projection of the patterned beam, the substrate is held. After measuring wave front aberrations of the projection system the sensor module may then be replaced by the substrate, such that the projection of the patterned beam onto the target portions of the substrate may continue. An advantage is that when the sensor and the pinhole plate are built into a sensor module, the mass of the sensor module will not add to the mass of the substrate table during normal operation of the lithographic projection apparatus, and a further advantage is that the sensor doesn't occupy any space in the substrate table.

According to a further aspect of the present invention, there is provided a method of measuring wave front aberrations of a projection system in a lithographic projection apparatus comprising:

a radiation system for providing a projection beam of radiation;
   a support structure for supporting patterning structure, the patterning structure serving to pattern the projection beam, according to a desired pattern, in an object plane traversed by the projection beam;
   a substrate table for holding a substrate;
   a projection system downstream of said object plane, for projecting the patterned beam onto a target portion of the substrate;
   an interferometric measurement system for measuring wave front aberrations of the projection system,
characterized in that the method comprises the following steps:
   providing a grating, featuring a grating pattern in a grating plane, into the projection beam, such that the grating plane is substantially coincident with said object plane;
   providing a pinhole and a detector to the projection beam at a location downstream of the projection system, such that radiation traversing the pinhole is detectable by the detector, whereby said pinhole is arranged in a pinhole plate and features a pinhole pattern in a pinhole plane, the pinhole plane being substantially coincident with a plane that is optically conjugate to said object plane, and whereby said detector comprises a detector surface that is substantially coincident with a detection plane downstream of the pinhole, whereby, in said detection plane, a spatial distribution of the electric field amplitude of the projection beam is substantially a Fourier Transformation of a spatial distribution of the electric field amplitude in the pinhole plane;
   illuminating the grating with the projection beam of radiation, and
   detecting an interference fringe pattern of radiation with said detector.

By phase stepping the grating and/or the pinhole the interference fringe pattern will move over the detector surface. Intensities, at a plurality of points on the detector surface, and detected as a function of phase step, can be used for calculating the wave front aberration, as is discussed, for example, in D. Malacara, "Optical Shop Testing", John Wiley & Sons, Inc., New York, second edition, chapter 14. This measurement has to be repeated at a particular measurement position a plurality of times, whereby the grating or the pinhole has to be moved over a distance equal to a phase step in one or more preselected directions along which the grating pattern or the pinhole pattern is periodic. A phase step of, for example, the grating should preferably be smaller or equal to ⅓ of the period (or ⅓ of the grating period plus an integer number of grating periods) of the grating pattern along said one or more preselected directions. The term period refers to the distance over which a periodic structure along a preselected direction in the grating pattern is repeated. With this measurement one can measure wave front aberrations at a particular measurement position and in a particular direction in the imaged field. To obtain information on wave front aberrations at a plurality of points in the field one should measure the wave front aberration at a corresponding plurality of measurement points in the imaged field along at least two directions. Phase stepping can be provided by moving the grating and/or moving the pinhole. It is advantageous to move the grating because, due to the magnification M (with M<1) of the projection system, the accuracy requirements for moving the grating (located upstream of the projection system) by the mask table are lower than for moving the pinhole (located downstream of the projection system).

Although specific reference may be made in this text to the use of the apparatus according to the invention in the manufacture of ICs, it should be explicitly understood that such an apparatus has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle", "wafer" or "die" in this text should be considered as being replaced by the more general terms "mask", "substrate" and "target portion", respectively.

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range 5–20 nm).

BRIEF DESCRIPTION OF THE DRAWINGS

Embodiments of the invention will now be described, by way of example only, with reference to the accompanying schematic drawings in which.

In the drawings, like references indicate like parts.

DETAILED DESCRIPTION

Embodiment 1

Figure 1:
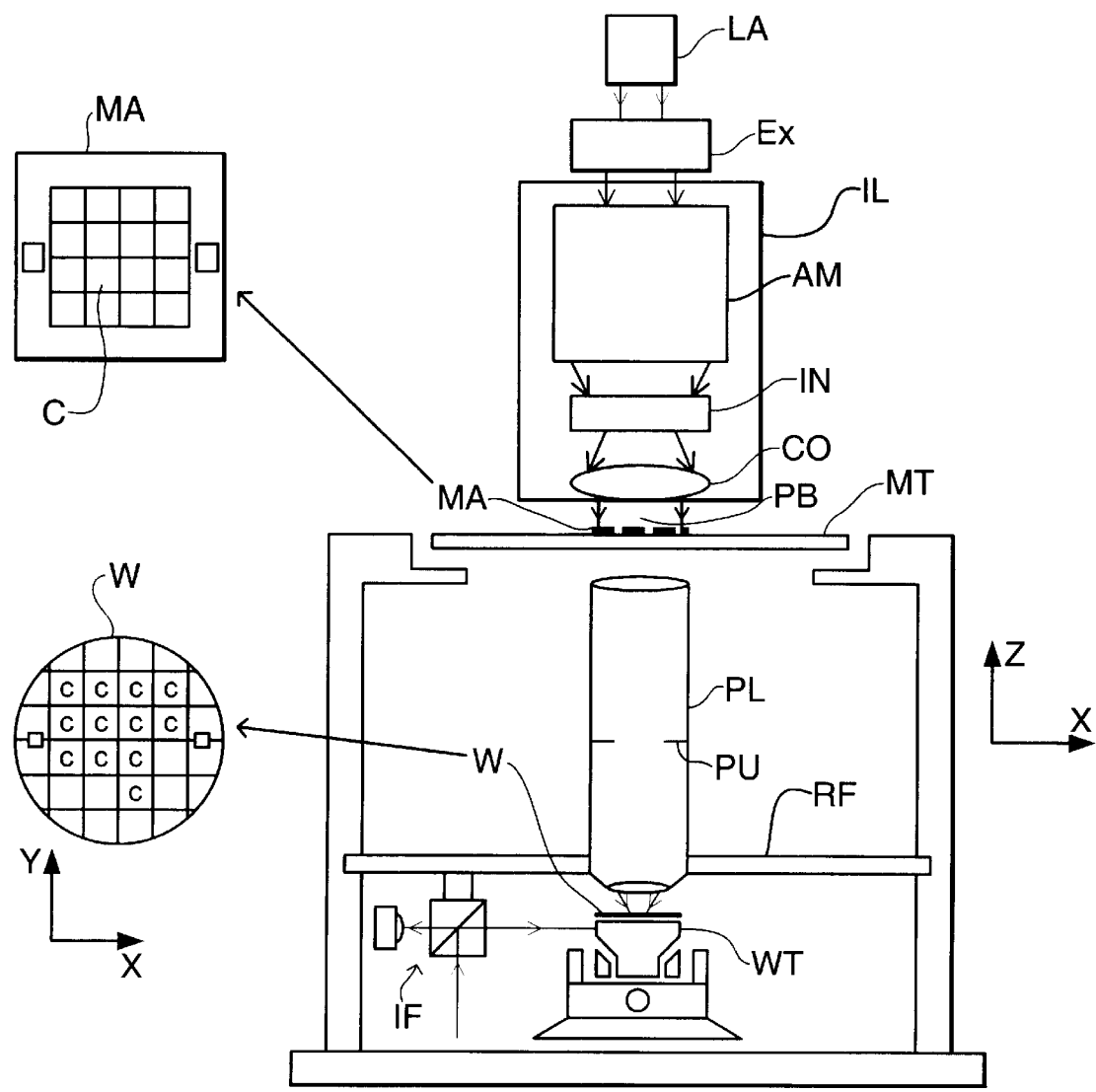
FIG. 1 depicts a lithographic projection apparatus according to the invention.

FIG. 1 schematically depicts a lithographic projection apparatus according to a particular embodiment of the invention. The apparatus comprises:

- a radiation system Ex, IN, CO for supplying a projection beam PB of radiation (e.g. UV or EUV radiation). In this particular case, the radiation system also comprises a radiation source LA;
- a first object table (mask table) MT provided with a mask holder for holding a mask MA (e.g. a reticle), and connected to first positioning means for accurately positioning the mask with respect to item PL;
- a second object table (substrate table) WT provided with a substrate holder for holding a substrate W (e.g. a resist-coated silicon wafer), and connected to second positioning means for accurately positioning the substrate with respect to item PL;
- a projection system ("lens") PL (e.g. a refractive or catadioptric system or a mirror group) for imaging an irradiated portion of the mask MA onto a target portion C (e.g. comprising one or more dies) of the substrate W. The projection system PL comprises a pupil PU in a pupil plane. Generally, the pupil PU is a circular aperture which controls the numerical aperture of the projection beam radiation impinging on the substrate W. As here depicted, the apparatus is of a transmissive type (i.e. has a transmissive mask). However, in general, it may also be of a reflective type, for example (with a reflective mask). Alternatively, the apparatus may employ another kind of patterning structure, such as a programmable mirror array of a type as referred to above.

The source LA (e.g. a HG lamp, excimer laser, an undulator provided around a path of an electron beam in a storage ring or synchrotron, or a plasma source) produces a beam of radiation. This beam is fed into an illumination system (illuminator) IL, either directly or after having traversed conditioning means, such as a beam expander Ex, for example. The illuminator IL may comprise adjusting means AM for setting the outer and/or inner radial extent (commonly referred to as σ-outer and σ-inner, respectively) of the intensity distribution in the beam. In addition, it will generally comprise various other components, such as an integrator IN and a condenser CO. In this way, the beam PB impinging on the mask MA has a desired uniformity and intensity distribution in its cross-section.

It should be noted with regard to FIG. 1 that the source LA may be within the housing of the lithographic projection apparatus (as is often the case when the source LA is a mercury lamp, for example), but that it may also be remote from the lithographic projection apparatus, the radiation beam which it produces being led into the apparatus (e.g. with the aid of suitable directing mirrors); this latter scenario is often the case when the source LA is an excimer laser. The current invention and claims encompass both of these scenarios.

The beam PB subsequently intercepts the mask MA, which is held on a mask table MT. Having traversed the mask MA, the beam PB passes through the lens PL, which focuses the beam PB onto a target portion C of the substrate W. With the aid of the second positioning means (and interferometric measuring means IF), the substrate table WT can be moved accurately, e.g. so as to position different target portions C in the path of the beam PB. Similarly, the first positioning means can be used to accurately position the mask MA with respect to the path of the beam PB, e.g. after mechanical retrieval of the mask MA from a mask library, or during a scan. In general, movement of the object tables MT, WT will be realized with the aid of a long-stroke module (course positioning) and a short-stroke module (fine positioning), which are not explicitly depicted in FIG. 1. However, in the case of a wafer stepper (as opposed to a step-and-scan apparatus) the mask table MT may just be connected to a short stroke actuator, or may be fixed.

The depicted apparatus can be used in two different modes:

In step mode, the mask table MT is kept essentially stationary, and an entire mask image is projected at once (i.e. a single "flash") onto a target portion C. The substrate table WT is then shifted in the x and/or y directions so that a different target portion C can be irradiated by the beam PB;

In scan mode, essentially the same scenario applies, except that a given target portion C is not exposed in a single "flash". Instead, the mask table MT is movable in a given direction (the so-called "scan direction", e.g. the y direction) with a speed v, so that the projection beam PB is caused to scan over a mask image; concurrently, the substrate table WT is simultaneously moved in the same or opposite direction at a speed V=Mv, in which M is the magnification of the lens PL (typically, $|M|=\frac{1}{4}$ or $\frac{1}{5}$). In this manner, a relatively large target portion C can be exposed, without having to compromise on resolution.

Figure 2:
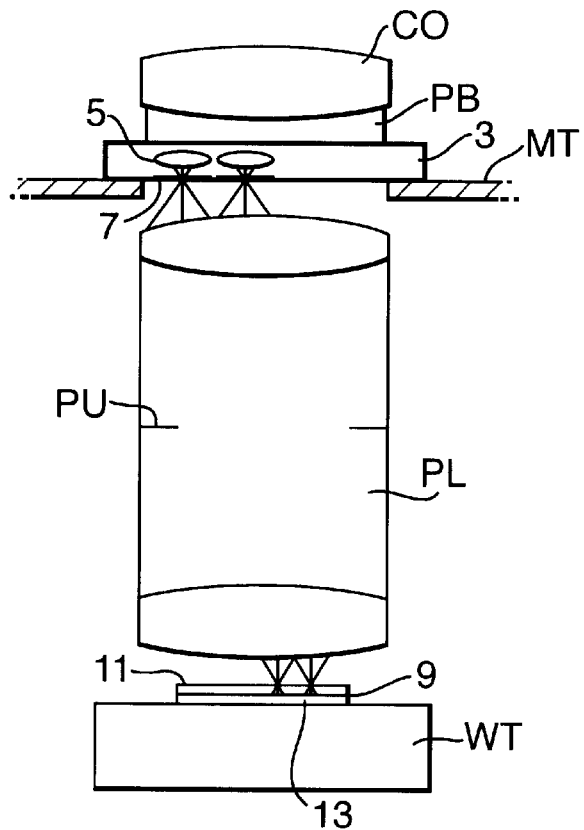
FIG. 2 shows an embodiment of a wave front aberration measuring system incorporated in the lithographic projection apparatus according to FIG. 1.

FIG. 2 shows a wave front aberration measurement system incorporated in the lithographic projection apparatus according to an embodiment of the invention. In this figure the following items of the system can be seen, which are shared with the lithographic projection apparatus: condensor lens CO, mask table MT, projection system PL, and wafer table WT. Further the wave front aberration measuring system comprises the following items:

- a grating module 3, which may be provided to the mask table MT occasionally, or which may form a part of said table, said grating module 3 comprising at least one pair of a grating module lens 5 and grating 7, featuring a grating pattern in a grating plane; and a sensor module 9, which may be provided to the substrate table WT occasionally or which may form a part of said substrate table WT, said sensor module 9 comprising a detector 13 and a pinhole plate 11, provided with a pinhole featuring a pinhole pattern in a pinhole plane.

Figure 3A:
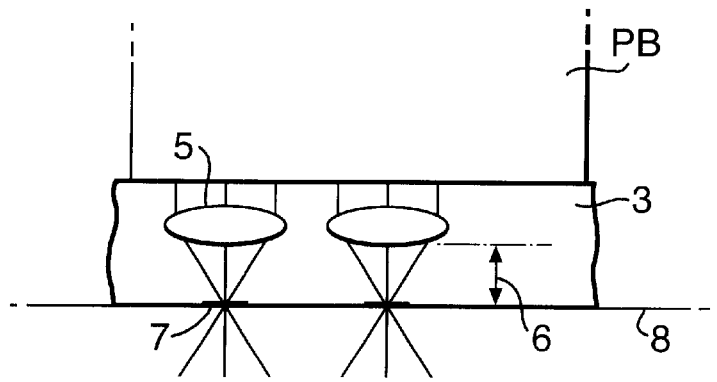
FIG. 3A shows a detailed view of a grating module usable in the wave front aberration measurement system of FIG. 2.

FIG. 3A shows a more detailed view of the grating module 3. A substantially uniform and parallel projection beam PB emerging from the illuminator IL provides radiation to the grating module 3. The grating module lens 5 (FIG. 3A shows plurality grating module lenses 5 as a possible embodiment; here only one lens 5 is discussed), having a positive back focal distance 6, focuses an incident fraction of the projection beam PB on the grating 7 comprising a grating pattern in the grating plane 8, such that the uniform illumination over the field of said fraction of the projection beam PB is transformed into a substantially uniform angular distribution of illumination radiation. One of the advantages of using lens 5 is that the intensity in the focal point of the lens 5 is increased over the intensity of unfocused illumination radiation. The grating diffracts the focused radiation and generates a spatial coherence distribution for the interfering wave fronts at the detection plane. The grating module lens is chosen such that the zeroth diffracted order of the beam incident on lens 5 fills the pupil PU in the pupil plane of the projection system PL. Said filling of the pupil PU is necessary to assure that the measurement result comprises wave front aberrations of a substantially unvignetted wave front, at the numerical aperture as defined by the diameter of the pupil PU. The grating 7 may be chosen such that $-1^{st}$ and $+1^{st}$ order diffracted beams of radiation have at least some overlap in the pupil plane of the pupil PU.

Embodiment 2

Figure 3B:
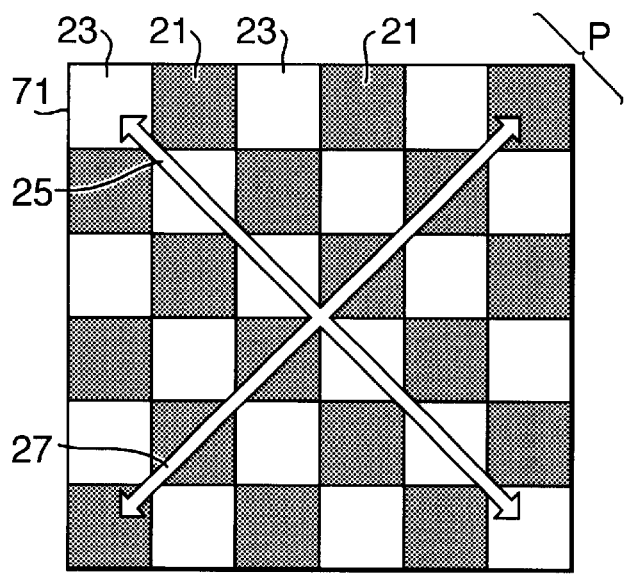
FIG. 3B shows a top view of a two-dimensional grating pattern usable in the grating module of FIG. 3A.

In an embodiment of the invention the grating 7 comprises a two-dimensional grating pattern 71 such as is shown in FIG. 3B. In this embodiment grating 7 comprises a plurality of two different regions 23 and 21 having a mutually different transmission (or, for example, having a mutually different optical path length to provide mutually different phase retardations, or having a mutually different reflectance) in order to diffract the radiation and to generate a two dimensional spatial coherence distribution for radiation wave fronts at the detection plane. The shape of the regions 23 and 21 may for example be substantially square, in which case the grating as shown in FIG. 3B is equivalent to a set of two gratings with the lines and spacings oriented along two corresponding, mutually orthogonal directions indicated by the arrows 25 and 27. The period of the grating pattern 71 along the directions 25 and 27 is equal to the distance denoted by P in FIG. 3B. The use of a two-dimensional grating pattern is advantageous, because one two-dimensional grating pattern such as shown in FIG. 3B can be used to take samples of the interference fringe pattern in a detection plane in two directions perpendicular to each other. The arrows 25 and 27 show two directions in which the grating 7 can be moved (for phase stepping) through the projection beam PB between two samples. When the source LA is an eximer laser, one sample comprises a number of pulses that are irradiated by the radiation system through the grating 7, the projection system PL and the pinhole plate 11 upon the detector 13. Since a spatial averaging of information contained by the interference pattern along one of the directions 25 or 27 is, in this case, necessary for each phase step, this embodiment is sensitive to pulse-to-pulse radiation energy variations. After a first sample the grating 7 has to be moved (i.e. phase stepped) with respect to the pinhole plate over a distance equal to a single phase step. The phase step may be chosen such that at least three samples are taken before the grating 7 is moved over a distance equal to one period P.

Embodiment 3

Figure 3C:
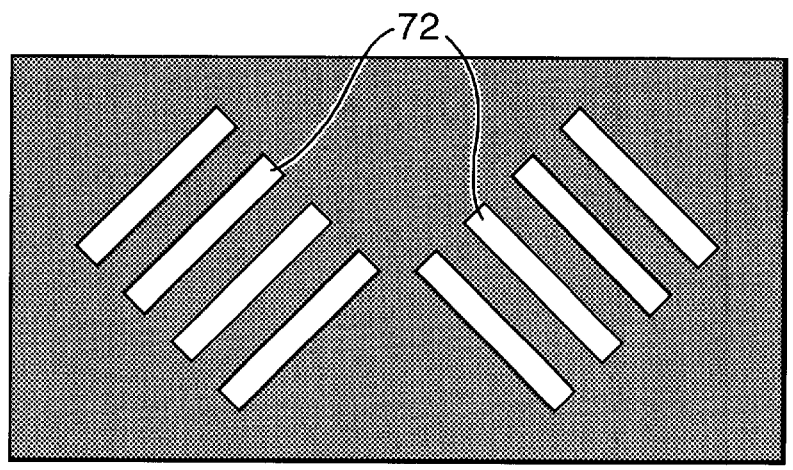
FIG. 3C shows a top view of a two one-dimensional grating patterns usable in the grating module of FIG. 3A.
Figure 3C:
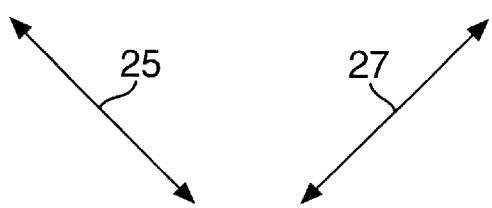

In an other embodiment of the invention the grating 7 comprises two one-dimensional grating patterns with the lines and spacings oriented along two corresponding, different (for example, mutually orthogonal) directions. For example, the grating 7 may comprise two one-dimensional grating patterns 72, such as illustrated in FIG. 3C, with the lines and spacings oriented along said directions 25 and 27, respectively. By properly projecting just one of the two grating patterns on the pinhole, one obtains the advantage that, in the detection plane, the spatial coherence is such that the measurement system is mainly sensitive to wave front aberrations in the direction perpendicular to the direction of the lines and spaces of said one of the two grating patterns. Therefore, a spatial averaging of information contained in the interference pattern along the direction of the lines and spaces is not necessary. Consequently, the measurement system is less sensitive to pulse-to-pulse energy variations of the projection beam and exposure dose variations, resulting in an improvement of measurement accuracy over the accuracy obtained with embodiment 2.

Embodiment 4

Figure 4A:
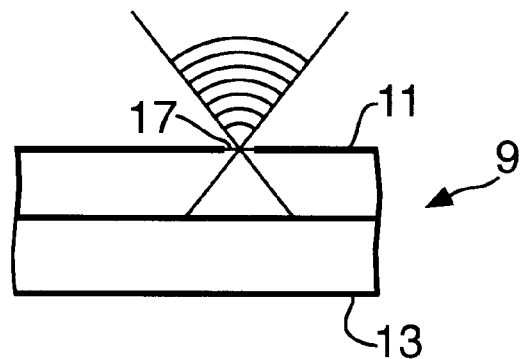
FIG. 4A shows a view of a sensor module for use in the wave front aberration measurement system of FIG. 2.
Figure 4B:
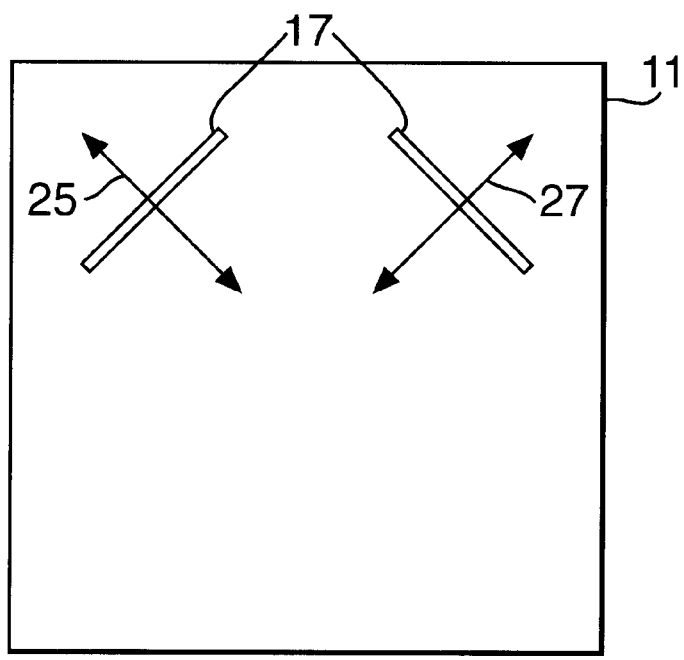
FIG. 4B shows a top view of the pinhole plate of the sensor module of FIG. 4A.
Figure 4C:
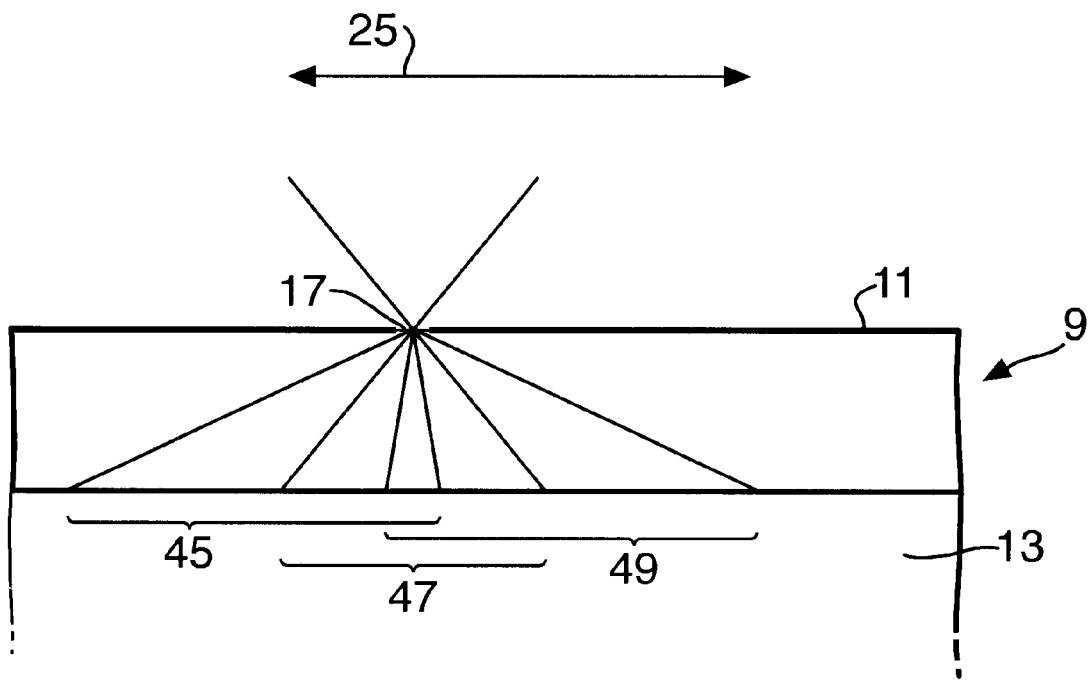
FIG. 4C shows a longitudinal section of a pinhole of the sensor module of FIG. 4A.

FIG. 4A shows a more detailed view of an embodiment of a sensor module 9. Radiation emerging from the projection system PL is focussed upon a pinhole 17 provided to the pinhole plate 11 and is subsequently detected by detector 13. FIG. 4B depicts a top view of the pinhole plate 11 and pinholes 17. In this embodiment the pinhole plate 11 comprises two pinholes 17 embodied as slit-shaped apertures; each pinhole is used for shearing diffracted wave fronts (at the detection plane) in a phase step direction substantially orthogonal to the slit, as depicted by the arrows 25 or 27 in FIG. 4B. It should be noted that the phase step directions depicted by the arrows 25 and 27 in FIG. 3B correspond to the arrows 25 and 27 in FIG. 4B. FIG. 4C shows a detailed section (in a plane perpendicular to the plane of FIG. 4B) of one of the pinholes in FIG. 4B. The arrow 25 shows the direction, in which the pinhole 17 or the grating 7 should be phase stepped. The radiation focused upon the pinhole 17 will be diffracted and detected by the detector 13. Wave fronts sheared with respect to each other are provided by diffraction at the slit. The area denoted by 45 schematically indicates an area that receives radiation from a plurality of radiation wave fronts diffracted at the slit and characterized by a finite range of diffraction orders (not including the zeroth diffraction order), the area denoted by 47 receives radiation from the radiation wave front of zeroth diffraction order, and the area denoted by 49 receives radiation from a plurality of radiation wave fronts diffracted at the slit and characterized by a range of diffraction orders defined by said finite range of diffraction orders with opposite sign.

Figure 4D:
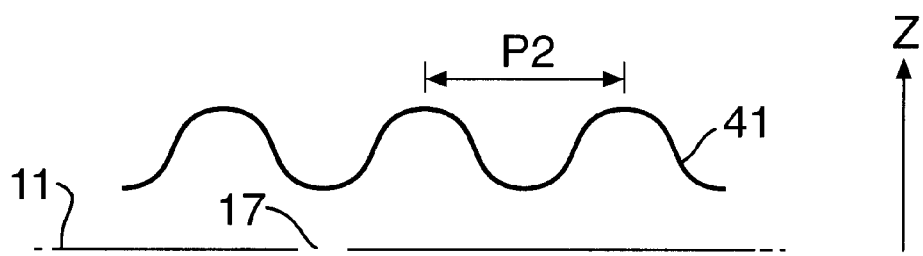
FIG. 4D shows a detailed view of the pinhole of FIG. 4C.

During a wave front aberration measurement one can, for example, phase step the grating module 3 through the projection beam PB in a first direction with small phase steps to measure the wave front aberration at a particular fixed measurement point in the imaged field. This measurement can be repeated for another, second direction at said particular point. For this purpose one can, for example, use the two-dimensional grating pattern 71 as shown in FIG. 3B, which represents two sets of lines and spaces with a periodicity along the first and second directions depicted by the arrows 27 and 25, respectively. Alternatively, one can, for example, use the grating pattern 72 as shown in FIG. 3C. The pinholes 17 in the pinhole plate 11 comprise slit-shaped pinhole patterns, and therefore it is necessary to use two pinholes, one for measurements in the first direction 27 and a second pinhole for measurements in the second direction 25. Preferably a measurement of the wave front aberration at a plurality of image field points is carried out. The wave front aberration measurement should then be repeated in the first and second direction at a corresponding plurality of measurement points distributed over the image field. FIG. 4D shows a detailed view of the pinhole 17 embodied as a slit-shaped aperture (in a plane perpendicular to the plane of FIG. 4B, and viewed along the slit). The intensity of the aerial image 41 of the grating 7 on the pinhole plate 11 is also shown, as a plot along the z-axis. This aerial image has a period P2 that depends on the period P of the grating pattern and the magnification M of the projection system PL according to the formula:

$$P2=P \times M$$

The width of the slit-shaped pinhole 17 may be smaller than half of the distance P2, because otherwise the intensity measured by the detector 13 would be averaged and detector 13 would tend to become less sensitive. For improving the sensitivity of the measurement system it is possible to provide a pinhole with a pinhole pattern comprising, for example, a plurality of parallel, slit-shaped apertures to the pinhole plate 11. Two such pinholes may be provided to the pinhole plate, with pinhole patterns similar to the pattern illustrated in FIG. 3C. The parallel, slit-shaped apertures can be located at a distance equal to P2 from each other, such that the slit-shaped spaces are located at the same relative position within one period P2 of the image 41. Further, the pinhole 17 can be phase stepped, for example, with a phase step of at most of ⅓ of P2. The detector 13, which for example may be a two-dimensional sensor array such as a CCD camera, can measure the total energy received through a pinhole 17 (for calibration purposes) upon integrating the detected signals over the whole detector surface. The detector 13 also measures the energy of radiation received out of a particular direction: the different areas (the different pixels in case of a CCD) of the detector 13 will measure the energy of the radiation received from a particular direction (corresponding to a particular position in the pupil PU), as defined geometrically by the relative position of the pinhole 17 with respect to the area in question. The detector 13 may take the form of a CCD camera connected to a processing unit comprising a calculation device and a memory device. The processing unit may be used to calculate wave front aberrations from intensity changes (as measured per pixel and as a function of phase step) and to store these data in the memory device.

Figure 5A:
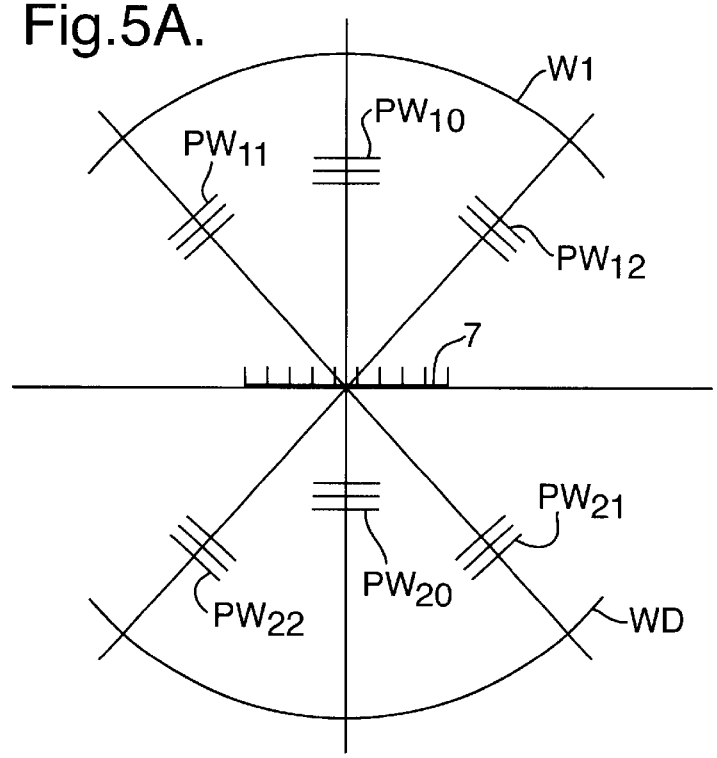
FIG. 5A shows a wave front impinging on the grating of the grating module of FIG. 3A.
Figure 5B:
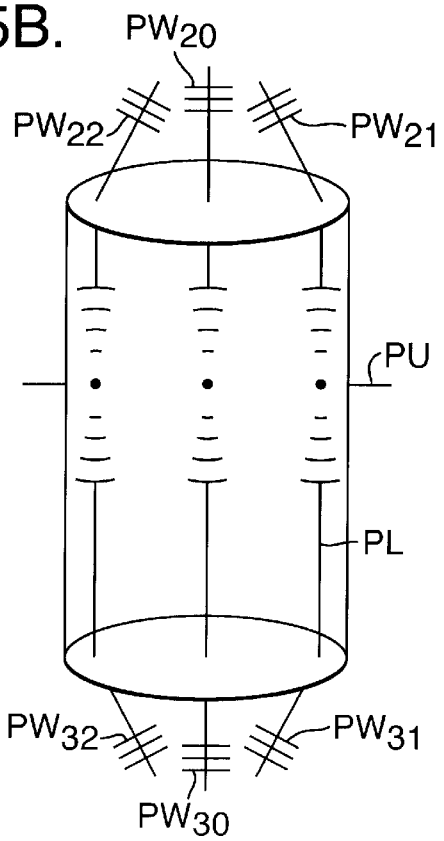
FIG. 5B shows a wave front traversing the projection system of FIG. 2.
Figure 5C:
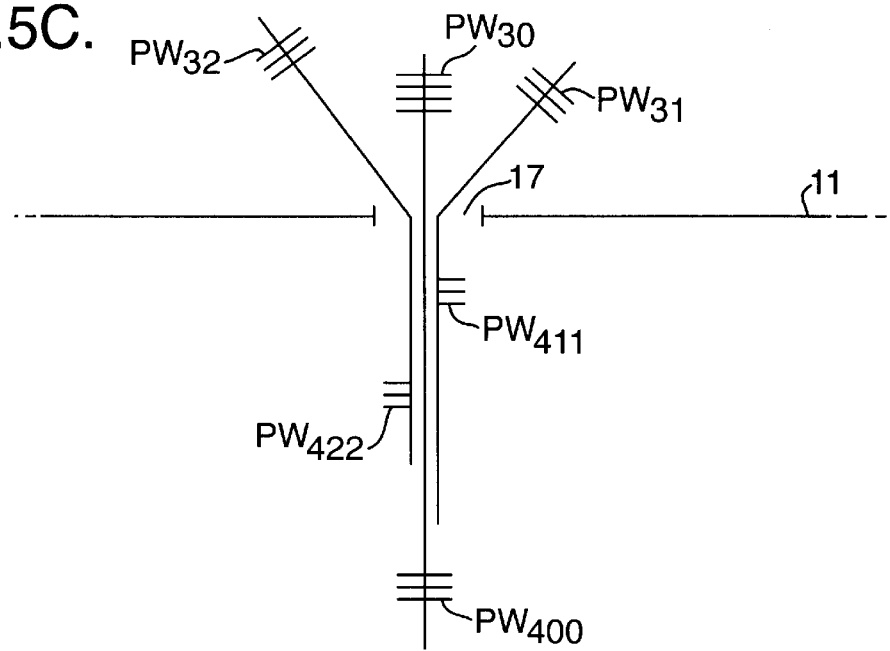
FIG. 5C shows wave front recombination at the sensor module of 4A.

In FIG. 5A the projection beam impinging on the grating 7 is shown. The wave WI can be considered as a Fourier sum of plane waves PW (1,i), [i=0,1,2 . . . ]. The wave emanating from grating 7, WD, can be considered as a sum of diffracted plane waves PW (2,i), [i=0,1, 2 . . . ]. PW (22), PW (20) and PW (21) are, respectively, the +1$^{st}$, zeroth and −1$^{st}$ diffracted order of the incoming wave PW (10). In the projection system PL (see FIG. 5B) the plane waves PW (2i), [i=0, 1, 2 . . . ] will focus near or at the pupil plane PU, and sample the pupil plane in three points. The lens aberrations can be thought of as phase errors that are endowed on the focussed plane waves PW (2i), [i=0, 1, 2 . . . ] in the pupil plane. These focussed plane waves will exit the lens as plane waves PW (3i), [i=0, 1, 2 . . . ], respectively. To measure the phase errors representing for the lens aberrations, the plane waves PW (3i), [i=0,1, 2 . . . ] are directionally recombined by diffraction at slit 17 see FIG. 5C. For instance, PW (400) is the zeroth order diffracted wave originating from PW (30), PW (411) is the +1$^{st}$ order diffracted wave from PW (31) and PW (422) is the −1$^{st}$ order diffracted wave originating from PW (32) and these directionally recombined waves can interfere. Their interference intensity is harmonic with the phase stepping of grating 7. Other recombination's of diffracted waves originating from the PW (3i) [i=0.1.2 . . . ], are possible as well. However, the intensity resulting from the interference of such recombination varies as a higher harmonic of the phase stepping movement of grating 7. Such higher order harmonic signals can be filtered out from each CCD-pixel signal. The description in this paragraph of diffraction phenomena is not accounting for spatial coherence effects, but is appropriate for illustrating the occurrence of signals that vary as higher harmonics of the phase stepping movement.

Embodiment 5

The measurement of aberrations according to the present invention with a CCD as detector comprises measuring with each CCD pixel the intensity of an interference fringe pattern at the position of said each CCD pixel, and the change of intensity as a function of phase step. For the processing of such measurement data into wave front aberration data, it is desirable to identify the positions in the lens pupil PU which correspond to the position of said each CCD pixel. Therefore, a plurality of coefficients which associate positions at the detector surface to corresponding positions in a plane comprising the pupil is preferably available, for example as data stored in a memory device. Said coefficients can, to first approximation, be calculated from the lay out data of the pinhole in relation to the detector and the projection system. However, due to manufacturing errors the lay out data of the projection system may not be fully representative of the projection system in use. Similarly, the lay out of a sensor module comprising the pinhole and the detector may, for example, be affected by heating and cooling of the sensor module. Consequently, said coefficients, as calculated to first approximation, may not be accurate enough for use with processing the measurement data. In the present embodiment, a calibration of a preselected plurality of coefficients that associate positions at the detector surface to corresponding positions in a plane comprising the pupil can be provided by executing a method comprising the steps of:

obtaining a first plurality of measurement data representative of a first wave front aberration for a preselected field point;

applying a preselected displacement, parallel to the optical axis of the projection system, to the pinhole and the detector;

obtaining a second plurality of measurement data representative of a second wave front aberration for said preselected field point at said preselected displaced position of the pinhole and the detector;

calculating the expected difference between the first and the second wave front aberration using an optical system simulation computer program;

calculating the measured difference between the first and the second wave front aberration using said preselected plurality of coefficients and said first and second plurality of measurement data;

minimizing the difference between said expected and said measured difference by adapting said plurality of coefficients, which associate a position at the detector surface to a position in a plane comprising the pupil; and replacing the preselected plurality of coefficients by the adapted plurality of coefficients.

Executing the above described calibration will improve the accuracy of subsequent wave front aberration measurements with the pinhole and the detector moved in the position for normal usage. Additional preselected displacements parallel to the optical axis of the projection system can be applied, and wave front aberration differences can be measured and calculated, and the results can be incorporated in the minimization step in order to enhance the accuracy of the resulting adapted plurality of coefficients. An advantage of the method is that lay-out tolerances for the pinhole in relation to the detector can be relaxed.

Figure 6:
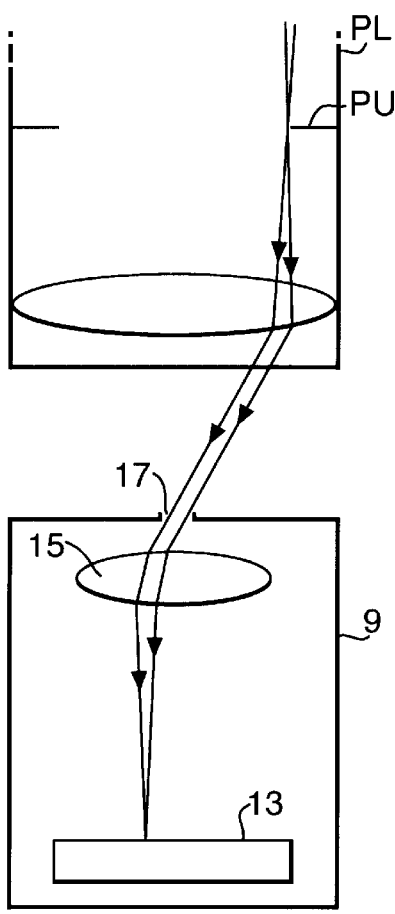
FIG. 6 shows a view of a second embodiment of a sensor module for use in the wave front aberration measurement system of FIG. 2.

The embodiment of FIG. 6 comprises an additional lens 15 and the detector 13 is arranged such that the detection plane of detector 13 is optically conjugate to the plane comprising the pupil PU. Generally, projection radiation traversing a point in the pupil PU of the projection system is substantially collimated radiation in the space between the projection system PL and the sensor module 9. Therefore, the back focal plane of lens 15 is a plane that is optically conjugate to the plane comprising the pupil PU; said back focal plane is also a Fourier Transformation plane of lens 15, suitable for the detection of an interference fringe pattern. Instead of one single lens 15 a lens system comprising, for example, two or more lense elements may be used. When a lens system is used the lens elements of the system may be configured similar to, for example, a microscope objective; in such an embodiment the positions in the lens pupil PU which correspond to the position of said each CCD pixel are, to first approximation related to each other through a single magnification factor.

Embodiment 6

In an alternative embodiment of the invention the sensor module 9 is provided with a pinhole featuring a two-dimensional pinhole pattern comprising square apertures arranged in a checkerboard pattern similar to the pattern as illustrated in FIG. 3B. In this alternative embodiment the grating module 3 is provided with a grating 7 having a grating pattern 72 comprising two one-dimensional gratings with the lines and spacings oriented along the directions 25 and 27, as illustrated in FIG. 3C, and phase stepping is provided by moving the grating 7. The detector 13 will in this embodiment be more sensitive to stray radiation (i.e. radiation reflected internally in the projection system PL and reflected to the detector 13), which will decrease the sensitivity of the detector 13. An advantage of the present embodiment is that the detection module is able to measure wave front aberrations in the two directions 25 and 27 while keeping the position of the detection module unchanged. Consequently, the relation between detector pixel positions and positions in the pupil is fixed for the wave front aberration measurement along the two directions 25 and 27, thereby increasing the accuracy of the measurement. It must be understood that the alternative wave front aberration measurement system as described in this paragraph and the wave front aberration measurement system according to the embodiments 1–5 described above can be used to measure the wave front aberration at a particular fixed measurement position. Different measurement scenario's can be used to measure the wave front aberration at different measurement points in an image field, as explained below.

Embodiment 7

If the lithographic apparatus in which the wave front aberrations have to be measured is a stepper, the mask table MT is in general not movable. During projection an entire mask image is projected at once (i.e. a single "flash") onto a target portion C. The grating 7 will in that case be kept stationary on the mask table and the number of measurement points which can be measured is equal to the number of illuminated points on the grating 7. For example, if wave front aberrations in a stepper at twenty measurement points in the image field are to be measured, twenty grating module lenses 5 to focus radiation upon twenty corresponding measurement points on the grating 7 must be provided. The pinhole plate 11 and the detector 13 on the substrate table WT can be moved by the substrate table WT, so that the pinhole 17 in the pinhole plate 11 can be moved into each of the twenty individual measurement points projected by the projection system PL and subsequently be stepped through those individual measurement points with phase steps to measure the wave front aberration at each individual measurement point. The measurement should be done in first and second directions at each individual measurement point so one could, advantageously, use a second pinhole in the pinhole plate 11. The measurement scenario described here may apply in any of the embodiments 1–6 described above.

The above mentioned measurement scenario may also be used when the lithographic projection apparatus is a scanner. However, since in a scanner both the mask table MT and the substrate table WT are movable, the phase steps could be accomplished by moving the grating 7 with the mask table MT. Due to the magnification M (typical magnification values are, for example, $M=-\frac{1}{4}$ and $M=-\frac{1}{5}$) of the projection system PL the accuracy requirements for moving and positioning the grating module 3 (upstream of the projection system PL) with the mask table MT are lower than for moving and positioning the sensor module 9 (provided with the pinhole plate 11 and detector 13) downstream of the projection system PL with the substrate table WT. Another advantage is that each pixel of the detector 13 (e.g. a CCD camera) downstream of the pinhole plate 11 will in that case measure the same pupil position during each phase step. This relaxes the accuracy requirements for calibration of the CCD, because the intensity of a particular pupil position is measured with the same pixel having the same error during each phase step. To measure the wave front aberration at different measurement points in the image field, the pinhole plate 11 and the detector 13 may be moved through the image field to every individual measurement point and measure the wave front aberration at said point by phase stepping of the grating 7. This scenario can be used with any of the embodiments mentioned above.

Measuring a scanned wave front in a scanner may follow another different measurement scenario: in the measurement system according to the invention the grating 7 will be moved simultaneously with the pinhole 17 and detector 13 during each sample, the pinhole 17 and detector 13 will be moved with a speed equal to the to the magnification times the speed of the grating 7. The direction of movement of the grating 7 with respect to the pinhole 17 and the detector 13 will be chosen such that the image 41 of the grating 7 projected upon the pinhole 17 will move in the same direction and with the same speed as the pinhole 17 and the detector 13 do. After a first sample is taken the grating 7 is moved with respect to the pinhole 17 and detector 13 with a phase step and a second sample is taken by moving the grating, again simultaneously with the pinhole 17 and detector 13. This will be repeated for a number of samples. Each pixel of the detector 13 downstream of the pinhole plate 11 will in that case measure the same pupil position during each phase step, which relaxes the accuracy requirements for calibration of the CCD. Another advantage is that the wave front aberration measurement thus obtained is an integrated wave front aberration measurement through the slit in the scanning direction. The measurement can be repeated for different positions in a direction perpendicular to the scanning direction to obtain wave front aberration measurements for the corresponding image field positions. This scenario can be used with any of the embodiments mentioned above.

The measurement results thus obtained may be used during production of lens elements to tune the form of the lens elements. If the lens element is mounted in the projection system one could also consider alteration of position of the different lens elements with respect to each other. When the projection system is integrated in the lithographic projection apparatus, the measurement result of the wave front aberration measurement may further be used to adjust the wavelength of the projection beam of radiation or the distance between the mask table and the projection system. Lens elements within the projection system may also be built spatially adjustable to minimize the aberrations. For particular lens designs, for example lenses for use with Extreme Ultra Violet radiation and lenses for use with Ultra Violet radiation with a wavelength of 157 nm, the use of mirrors in the projection system is considered. The shape of said mirrors may be fine tuned by actuators between the backside of the mirror and a stiff frame element supporting said mirror. The output signal of the wave front aberration measurement system may be used to adjust the shape of the mirrors such that the wave front aberrations in the projection beam are minimized.

While we have described above a specific embodiment of the invention it will be appreciated that the invention may be practiced otherwise than described. The description is not intended to limit the invention.

What is claimed is:

1. A lithographic projection apparatus comprising:
    a radiation system to provide a projection beam of radiation;
    a support structure to support patterning structure, the patterning structure serving to pattern the projection beam, according to a desired pattern, in an object plane traversed by the projection beam;
    a substrate table to hold a substrate;
    a projection system downstream of said object plane, to project the patterned beam onto a target portion of the substrate;
    an interferometric measurement system to measure wave front aberrations of the projection system, the interferometric measurement system including:
       a grating, including a grating pattern in a grating plane, said grating being movable into and out of the projection beam, such that the grating plane is substantially coincident with said object plane;
       a pinhole, including a pinhole pattern in a pinhole plane and arranged in a pinhole plate, said pinhole being movable into and out of the projection beam, such that the pinhole plane is substantially coincident with a plane downstream of the projection system and optically conjugate to said object plane, and
       a detector having a detector surface substantially coincident with a detection plane, said detection plane located downstream of the pinhole at a location where a spatial distribution of the electric field amplitude of the projection beam is substantially a Fourier transformation of a spatial distribution of the electric field amplitude of the projection beam in the pinhole plane.

2. A lithographic projection apparatus according to claim 1, wherein the patterning structure is a mask and the support structure is a mask table.

3. A lithographic projection apparatus according to claim 2, wherein the interferometric measurement system comprises a grating module to be held by the mask table at a location for holding the mask, the grating being provided to the grating module.

4. A lithographic projection apparatus according to claim 1, wherein said grating is provided to the support structure at a location away from a location for holding the patterning structure.

5. A lithographic projection apparatus according to claim 1, wherein the patterning structure additionally serves to pattern the projection beam according to the grating pattern.

6. A lithographic projection apparatus according claim 1, wherein said measurement system further comprises a lens having a positive back focal distance, said lens being positioned between the radiation system and the grating at a distance to the grating plane which is substantially equal to said back focal distance.

7. A lithographic projection apparatus according to claim 1, wherein said detector is provided to the substrate table.

8. A lithographic projection apparatus according to claim 1, wherein said pinhole plate is provided to the substrate table.

9. A lithographic projection apparatus according to claim 1, wherein the measurement system comprises a sensor module to be held by the substrate table at a location for holding the substrate, said sensor module comprising the detector and the pinhole plate.

10. A method of measuring wave front aberrations of a projection system in a lithographic projection apparatus comprising:
    projecting a patterned beam of radiation onto a target portion of a substrate having a radiation sensitive material thereon;
    providing a grating, featuring a grating pattern in a grating plane, into the projection beam, such that the grating plane is substantially coincident with an object plane including patterning structure;
    providing a pinhole and a detector to the projection beam at a location downstream of a projection system, such that radiation traversing the pinhole is detectable by the detector, whereby said pinhole is arranged in a pinhole plate and features a pinhole pattern in a pinhole plane, the pinhole plane being substantially coincident with a plane that is optically conjugate to said object plane, and whereby said detector comprises a detector surface that is substantially coincident with a detection plane downstream of the pinhole, whereby, in said detection plane, a spatial distribution of the electric field amplitude of the projection beam is substantially a Fourier transformation of a spatial distribution of the electric field amplitude in the pinhole plane;
    illuminating the grating with the projection beam of radiation, and
    detecting an interference fringe pattern of radiation with said detector.

11. A method according to claim 10, wherein said grating pattern has a grating period in a first direction along which the grating pattern is periodic, and is moved in said first direction, over a distance equal to a phase step, from a first position to a second position, after detecting the radiation, to repeat detecting the radiation at said second position of the grating pattern.

12. A method according to claim 11, wherein the distance equal to a phase step is at most one of n times the grating period and (n+i) times the grating period, where $0.3<n<0.4$ and where i is an integer number.

13. A method according to claim 10, wherein said grating pattern has a grating period along a first axis, along which the grating pattern is periodic, and wherein the pinhole pattern and the detector both have a first position and are moved along said first axis, over a distance equal to a phase step, to a second position, after detecting the radiation, to repeat detecting the radiation at said second position of the pinhole pattern and the detector.

14. A method according to claim 10, wherein said grating pattern has a grating period in a first direction and, during detection of the radiation traversing the pinhole, the support structure and the substrate table are moved in a direction parallel to said first direction, the substrate table having a speed equal to the magnification of the projection system times the speed of the support structure.

15. A method according to claim 10, wherein a calibration of a preselected plurality of coefficients which associate positions at the detector surface to corresponding positions in a plane comprising the pupil, is obtained by a method comprising the steps of:

obtaining a first plurality of measurement data representative of a first wave front aberration for a preselected field point;

applying a preselected displacement, parallel to the optical axis of the projection system, to the pinhole and the detector;

obtaining a second plurality of measurement data representative of a second wave front aberration for said preselected field point at said preselected displaced position of the pinhole and the detector;

calculating the expected difference between the first and the second wave front aberration using an optical system simulation computer program;

calculating the measured difference between the first and the second wave front aberration using said preselected plurality of coefficients and said first and second plurality of measurement data;

minimizing the difference between said expected and said measured difference by adapting said plurality of coefficients, which associate a position at the detector surface to a position in a plane comprising the pupil; and replacing the preselected plurality of coefficients by the adapted plurality of coefficients.

* * * * *